(12) United States Patent
Spreitzer et al.

(10) Patent No.: US 7,244,960 B2
(45) Date of Patent: Jul. 17, 2007

(54) SOLUTIONS OF ORGANIC SEMICONDUCTORS THAT CONTAIN ADDITIVES

(75) Inventors: Hubert Spreitzer, Viernheim (DE); Susanne Heun, Bad Soden (DE); Kevin Treacher, Northwich (GB); Neil Tallant, Manchester (GB); Stephen Yeates, Cheshire (GB); Beverly Brown, Warrington (GB)

(73) Assignee: Covion Organic Semiconductors GmbH (DE)

( * ) Notice: Subject to any disclaimer, the term of this patent is extended or adjusted under 35 U.S.C. 154(b) by 0 days.

(21) Appl. No.: 10/483,696

(22) PCT Filed: Jul. 18, 2002

(86) PCT No.: PCT/EP02/07978

§ 371 (c)(1),
(2), (4) Date: Mar. 1, 2004

(87) PCT Pub. No.: WO03/019693

PCT Pub. Date: Mar. 6, 2003

(65) Prior Publication Data

US 2004/0188672 A1  Sep. 30, 2004

(30) Foreign Application Priority Data

Jul. 21, 2001  (DE) ............................... 101 35 640

(51) Int. Cl.
*H01L 51/00*  (2006.01)
*H01L 51/40*  (2006.01)

(52) U.S. Cl. .......................................... 257/40; 438/99
(58) Field of Classification Search .................. 438/82, 438/99; 257/40
See application file for complete search history.

(56) References Cited

U.S. PATENT DOCUMENTS

| 5,681,381 | A | | 10/1997 | Auslander et al. | ......... 106/21 A |
| 5,965,281 | A | * | 10/1999 | Cao | ........................... 428/690 |
| 6,303,943 | B1 | * | 10/2001 | Yu et al. | ....................... 257/40 |
| 6,312,971 | B1 | * | 11/2001 | Amundson et al. | .......... 438/99 |
| 6,372,154 | B1 | * | 4/2002 | Li | ......................... 252/301.16 |
| 6,544,670 | B1 | * | 4/2003 | Kitano et al. | ................ 428/690 |
| 2002/0179898 | A1 | * | 12/2002 | Marks et al. | .................. 257/40 |

FOREIGN PATENT DOCUMENTS

| EP | 1083775 A1 | 3/2001 |
| WO | WO-02/072714 A1 | 9/2002 |
| WO | WO-03/038923 A1 | 5/2003 |

OTHER PUBLICATIONS

Hebner, T.R., et al, "Ink-jet printing of doped polymers for organic light emitting devices," Applied Physics Letters, American Institute of Physics 72:519-521, XP-000737411 (Feb. 2, 1998).

* cited by examiner

*Primary Examiner*—Stephen W. Smoot
(74) *Attorney, Agent, or Firm*—Connolly Bove Lodge & Hutz

(57) ABSTRACT

The present invention relates to solutions of organic semiconductors and their use in the production of electronic components.

11 Claims, No Drawings

US 7,244,960 B2

SOLUTIONS OF ORGANIC SEMICONDUCTORS THAT CONTAIN ADDITIVES

The present invention relates to solutions of organic semiconductors and to their use in the electronics industry.

In a variety of applications which in the broadest sense can be counted as part of the electronics industry, the use of organic semiconductors as active components (=functional materials) has already become reality or is expected in the near future. Thus, charge transport materials based on organic compounds (as a rule hole transport materials based on triarylamines) have for some years been used in copiers.

The use of specific semiconducting organic compounds, some of which are capable of emitting light in the visible region of the spectrum, is just being introduced on the market, for example in organic or polymeric electroluminescence devices.

The use of organic charge transport layers in applications such as organic integrated circuits (organic ICs) and organic solar cells has, at least in the research stage, progressed sufficiently far for introduction onto the market to be expected within the next few years.

The number of further possibilities is large, but can frequently only be regarded as modifications of the above-described processes, as the examples of organic solid-state laser diodes and organic photodetectors demonstrate.

In some of these modern applications, development has progressed a very long way, but there is, depending on the application, still a tremendous need for technical improvements.

In the case of organic electroluminescence devices and their individual components, viz. organic light-emitting diodes (OLEDs), introduction onto the market has already occurred, as the commercially available car radios having an "organic display" from Pioneer demonstrate. Even in the case of the high molecular weight variant (polymeric light-emitting diodes, PLEDs), introduction onto the market is to be expected in the very near future. Nevertheless, significant improvements are still necessary here in order to make these displays genuinely competitive or superior to the liquid crystal displays (LCDs) which currently dominate the market.

The general structure of PLEDs is described in WO 90/13148.

Further embodiments such as passive matrix addressing and active matrix addressing are explained in the references mentioned below.

The development of full-color display devices based on PLEDs stands out as a major objective. To be able to obtain such a full-color display device, it is necessary to develop coating processes which allow the three basic colors (red, green, blue (RGB)) to be applied physically separately. Since the polymers are applied in the form of solutions, printing processes are the method of choice here.

Owing to the ready controllability, the achievable resolution and the wide variability, work is at present focussed mainly on ink jet printing (IJP). However, other printing methods such as offset printing, transfer printing or gravure printing are also suitable in principle.

The ink jet printing process for producing PLEDs and corresponding displays has been described a number of times in the prior art.

This nearest prior art is described below:

EP-A-0880303 describes the principle and use of IJP for producing PLEDs for the first time. According to EP-A-0880303, a solution of an "organic luminescence material" or a solution of a corresponding precursor is applied by IJP to a photolithographically prepared substrate containing partitions and an anode.

The use of different types of solutions enables differently colored pixels to be produced in this way. This patent application tends to teach the principle rather than provide technical details as to how the process is carried out in practice and the problems to be solved on the way.

EP-A-1083775 (=WO 00/59267) points out for the first time various problems associated with solutions for producing organic films by IJP. Problems going beyond these and possible starting points for solving these are described in the unpublished application DE 10111633.0. These two applications are incorporated by reference into the present patent application.

EP-A-1083775, FIGS. 1 and 2, describes a detail in the production of active-matrix polymer LEDs (AM-PLEDs) which in practice can lead to problems. This detail mentioned here is explained more precisely in EP-A-989778.

The different pixels (picture elements) are separated from one another by means of banks (separators). These separators comprise, as is standard in the production of AM-LCD displays, polyimide, for example. It is naturally also possible to use other polymers such as polyacrylates and polymethacrylates. All these materials can be applied by a solution process and subsequently be photostructured.

These bank materials are generally relatively polar, i.e. it is relatively difficult to convey, for example, dispersions or solutions of conductive polymers (e.g. polythiophene derivatives such as PEDOT or polyaniline derivatives such as PANI) from these banks into the actually provided pixels. This is true both when full-surface coating (e.g. via spin coating) is carried out and when use is made of a printing process providing resolution, e.g. ink jet printing, if the droplets do not hit the pixels precisely. In this case, due to the strongly polar surface, either exclusively or at least partly the banks are then wetted, so that the active material dries on the separators and can therefore fulfill at most part, if any, of its actual function.

An analogous situation applies in the case of less polar solutions of organic semiconductors, e.g. solutions of light-emitting polymers. Here, there is then the additional problem, when the pixels are not completely covered, that later vapor deposition of cathode material results in contact between cathode and anode or conductive polymer, leading to a short circuit.

To circumvent this problem, attempts have been made to reduce the surface energy of the bank. This is normally achieved by treatment with a $CF_4$ plasma (cf., for example, EP-A-1083775), which leads to a stable surface which is not precisely defined and has a very large number of $CF_3$, $CF_2$ and CF groups. The surface energy can thus be adjusted via the time and intensity of the treatment (cf. the information in EP-A-989778).

It has now been found that this treatment helps to bring the very polar solutions or dispersions of organic conductors (see above) completely into the pixels provided. However, the less polar solutions of organic semiconductors are, contrary to what is said in EP-A-989778, only partly aided by this surface treatment, i.e. problems with parts of the solution which get onto the bank material during coating drying there and thus not being available for the actual use can continue to occur.

This results in a number of significant disadvantages:

1. The coating process is unreliable. There can be pixels which contain too little, if any, active material. This leads to failure of these pixels. A problem associated with this is that, even in the case of large VDUs having 100 000 picture elements, the failure of only a few individual pixels has a visible adverse effect and thus leads to a product which does not meet specifications.

2. If problem 1 is to be overcome, this can lead to a significantly increased control expenditure or a significantly increased consumption of active material to ensure that sufficient active material is present in each pixel.

There is therefore great interest in technical solutions to the last-mentioned problem circle. This is an object of the present invention.

It is therefore an object of the invention to provide solutions of organic semiconductors which do not wet, or barely wet, the separators on application to substrates containing treated separators and flow virtually completely into the spaces in between (e.g. pixels).

A boundary condition here is that the use properties of the layers produced from these solutions are at least as good as those of layers produced from conventional solutions.

Solutions of organic semiconductors, especially those used for producing PLEDs, have been described in the abovementioned patent applications EP-A-1083775 and DE 10111633.0 and the further patent application EP-A-1103590.

These generally comprise one or more organic solvents and one or more organic semiconductors.

Organic solvents proposed in EP-A-1083775 are, in particular, high-boiling aromatic solvents having a preferred boiling point above 200° C. and having the following characteristic: they are benzene derivatives having at least three carbon atoms in the side chain or chains. In the patent application mentioned, solvents such as tetralin, cyclohexylbenzene, dodecylbenzene and the like are said to be preferred. Analogously, EP-A-1103590 reports solvents in general having a vapor pressure (at the temperature of the coating process) of less than 500 Pa (5 mbar), preferably less than 250 Pa (2.5 mbar), and once again describes solvents or solvent mixtures of mainly (highly) substituted aromatics.

On the other hand, DE 10111633.0 refers to solvent mixtures consisting of at least two different solvents of which one boils in the range from 140 to 200° C. In general, the solvent mixtures described here likewise comprise mainly organic solvents such as xylenes, substituted xylenes, anisole, substituted anisoles, benzonitrile, substituted benzonitriles and also heterocycles such as lutidine.

The organic semiconductors are in principle not subject to any restriction. However, the following further details of these, for example as in DE 10111633.0, may be provided:

According to the invention, both low molecular weight organic semiconductors and polymeric organic semiconductors can be used.

Organic semiconductors are, for the purposes of the present text, organic or organometallic compounds which, as a solid or as a cohesive layer, have semiconducting properties, i.e. in which the energy gap between conduction band and valence band is from 0.1 to 4 eV.

Examples of organic semiconductors used in the solutions of the invention are low molecular weight organic semiconductors based on triarylamines (Proc. SPIE-Int. Soc. Opt. Eng. 1997, 3148, 306–312), aluminum tris-(8-hydroxyquinoline) (Appl. Phys. Lett. 2000, 76(1), 115–117), pentacenes (Science 2000, 287(5455), 1022–1023), oligomers (Opt. Mater. 1999, 12(2/3), 301–305), further fused aromatic systems (Mater. Res. Soc. Symp. Proc. 2000, 598, BB9.5/1–BB9.5/6) and further compounds as are described, for example, in *J. Mater. Chem.* 2000, 10(7), 1471–1507, and Handb. Adv. Electron. Photonic Mater. Devices 2001, 10, 1–51. The low molecular weight semiconductors disclosed in the abovementioned references are incorporated by reference into the present description and invention.

However, preference is given to using polymeric organic or organometallic semiconductors in the solutions of the invention.

For the purposes of the present description, polymeric organic semiconductors are, in particular, (i) the substituted poly-p-arylene-vinylenes (PAVs) which are soluble in organic solvents and are disclosed in EP-A-0443861, WO 94/20589, WO 98/27136, EP-A-1025183, WO 99/24526, DE-A-19953806 and EP-A-0964045, (ii) the substituted polyfluorenes (PFs) which are soluble in organic solvents and are disclosed in EP-A-0842208, WO 00/22027, WO 00/22026, DE-A-19981010, WO 00/46321, WO 99/54385, WO 00/55927, (iii) the substituted polyspirobifluorenes (PSFs) which are soluble in organic solvents and are disclosed in EP-A-0707020, WO 96/17036, WO 97/202877, WO 97/31048, WO 97/39045, (iv) the substituted poly-para-phenylenes (PPPs) which are soluble in organic solvents and are disclosed in WO 92/18552, WO 95/97955, EP-A-0690086, EP-A-0699699, (v) the substituted polythiophenes (PTs) which are soluble in organic solvents and are disclosed in EP-A-1028136, WO 95/05937, (vi) the polypyridines (PPys) which are soluble in organic solvents and are disclosed in T. Yamamoto et al., *J. Am. Chem. Soc.* 1994, 116, 4832, (vii) the polypyrroles which are soluble in organic solvents and are disclosed in V. Gelling et al., *Polym. Prepr.* 2000, 41, 1770, (viii) substituted, soluble copolymers comprising structural units of two or more of classes (i) to (vii), (ix) the conjugated polymers which are soluble in organic solvents and are disclosed in *Proc. of ICSM '98*, Part I & II (in: *Synth. Met.* 1999, 101+102), (x) substituted and unsubstituted polyvinylcarbazoles (PVKS) as disclosed, for example, in R. C. Penwell et al., *J. Polym. Sci., Macromol. Rev.* 1978, 13, 63–160, and (xi) substituted and unsubstituted triarylamine polymers, preferably those disclosed in JP 2000-072722.

These polymeric organic semiconductors are incorporated by reference into the disclosure of the present invention.

Suitable organometallic semiconductors include both defined organometallic complexes as described, for example, in U.S. Pat. No. 6,048,630 and WO-01/08230 and also organometallic complexes which are copolymerized into polymers, as described, for example, in the unpublished patent application DE 10114477.6.

The polymeric organic semiconductors used according to the invention can also be used in doped form and/or as blends with one another.

For the present purposes, doped means that one or more low molecular weight substances are mixed into the polymer; blends are mixtures of more than one polymer which do not all necessarily have to display electrooptical activity.

The solutions and dispersions of the invention contain from 0.01 to 20% by weight, preferably from 0.1 to 15% by weight, particularly preferably from 0.25 to 10% by weight, very particularly preferably from 0.25 to 5% by weight, of the organic semiconductor. According to the invention, it is also possible to use a mixture/blend of more than one organic semiconductor.

These solutions of organic. semiconductors described in the abovementioned patent applications generally have the problem that they also adhere to the above-described treated separators or partly remain adhering to these. Thus, they suffer from the abovementioned problems at least in part.

It has now surprisingly been found that the solutions as described in the abovementioned patent applications EP-A-1083775, EP-A-1103590 and DE 10111633.0 can be improved greatly by addition of additives so that they subsequently no longer adhere to the treated bank materials and thus alleviate the above-described disadvantages.

If these additives are used in a technically practicable concentration range, the use properties of the films produced also remain unchanged.

The invention accordingly provides solutions of organic semiconductors containing one or more additives.

These additives are neither solvents for the organic semiconductors nor organic semiconductors themselves.

The additives used according to the invention are organic compounds containing heteroatoms as important elements, surfactants or compounds having amphiphilic character.

The heteroatoms are preferably silicon, germanium and/or fluorine.

Preferred additives according to the invention are organic siloxane-containing compounds, i.e. compounds containing one or more —O—SiR$^1$R$^2$ groups, where R$^1$, R$^2$ are identical or different and are each H, a linear, branched or cyclic C$_1$–C$_{12}$-alkyl group in which one or more nonadjacent carbon atoms may also be replaced by O or S and one or more H atoms may be replaced by F, or a C$_2$–C$_{14}$-aromatic or heteroaromatic which may be substituted by one or more substituents R$^3$;

R$^3$ are identical or different and are each a linear, branched or cyclic C$_1$–C$_{12}$-alkyl or alkoxy group in which one or more nonadjacent carbon atoms may also be replaced by O or S and one or more H atoms may be replaced by F, or F or Cl.

The siloxane-containing compounds to be used according to the invention preferably comprise more than 50%, particularly preferably more than 75%, of siloxane units, based on the total number of repeating units in the molecule.

Solutions according to the invention are then solutions as set forth in the abovementioned patent applications EP-A-1083775, EP-A-1103590 and DE 10111633.0 which comprise not only the solvents and the organic semiconductors but also one or more additives according to the invention in a technically practicable concentration.

A technically practicable concentration of the additive ranges, depending on the application, from 0.01% to 50% (proportions by mass) based on the amount of the organic semiconductor(s) in the solution. Preference is given to the range from 0.01% to 10%, and particular preference is given to the range from 0.01% to 2%. This means that, in the case of the use of, for example, a 1% strength semiconductor solution (m/v; mass/volume), the ratio of additive to solvent ranges from 0.0001 to 0.5% (m/v).

The additives used according to the invention are, as described above, preferably siloxanes or siloxane-containing compounds, either as pure substances or as mixtures of at least two substances.

They can be of low molecular weight (i.e. having a molecular weight of less than 1000 g/mol) or polymeric in nature (i.e. having a molecular weight of at least 1000 g/mol).

Low molecular weight siloxanes or siloxane-containing compounds can be linear compounds having from about 1 to 10 siloxane units, for example tetraalkylsiloxanes, hexaalkyldisiloxanes, octaalkyltrisiloxanes, decaalkyltetrasiloxanes, dodecaalkylpentasiloxanes, tetraarylsiloxanes, hexaaryidisiloxanes, octaaryltrisiloxanes, decaaryltetrasiloxanes, dodecaarylpentasiloxanes, and also mixed alkyl-aryl oligosiloxanes; these monosiloxane- or oligosiloxane-containing groups can, for example, also have nonsiloxane-type groups or end groups, e.g. hydrogen, chlorine, fluorine, amino, dialkylamino, carbonyloxy, carboxyl, alkyne, alkene, mercapto, alkyloxy or aryloxy groups and others.

The low molecular weight siloxanes or siloxane-containing compounds can also be cyclic compounds, for example hexaalkylcyclotrisiloxane, octaalkylcyclotetrasiloxane, decaalkylcyclopentasiloxane, hexaarylcyclotrisiloxane, octaarylcyclotetrasiloxane, decaarylcyclopentasiloxane, and also mixed alkyl-aryl cyclooligosiloxanes; here too, some of the alkyl or aryl groups may be replaced by other substituents such as hydrogen, chlorine, fluorine, amino, dialkylamino, carbonyloxy, carboxyl, alkyne, alkene, mercapto, alkyloxy or aryloxy groups and others.

Polymeric siloxanes or siloxane-containing compounds can comprise linear, branched or macrocycle-containing structural units. The polymers can be either homopolymers or copolymers. Copolymers can be random, alternating or block copolymers.

Polymeric siloxanes or siloxane-containing compounds used according to the invention have a molecular weight of at least 1000 g/mol. They preferably have a maximum molecular weight of less than 100 000 g/mol, particularly preferably less than 50 000 g/mol, very particularly preferably less than 20 000 g/mol.

Polymeric siloxanes and siloxane-containing compounds used according to the invention can be, for example, polydialkylsiloxanes, polydiarylsiloxanes, polyalkylarylsiloxannes, polydialkylsiloxane-co-diarylsiloxanes, and also further copolymers or polymers which further comprise NONSILOXANE groups. These are, for example, siloxane-containing copolymers comprising siloxane groups together with polyether, polyester, polyacrylate or polymethacrylate structural elements as nonsiloxane groups. They can be random, alternating or block copolymers, or else "grafted" copolymers.

Many of the above-described siloxanes, cyclic siloxanes and polysiloxanes are commercially available or can readily be obtained from commercial precursors.

Examples of commercially available siloxanes are dodecamethylpentasiloxane (Aldrich), hexamethylcyclotrisiloxane SIH6105.0 (Gelest/ABCR), octamethylcyclotetrasiloxane SIO6700.0 (Gelest/ABCR), triphenyltrimethylcyclotrisiloxane SIT8705.0 (Gelest/ABCR), 1,3,5-trimethyl-1,3,5-tris(3,3,3-trifluoropropyl)cyclotrisiloxane (Lancaster), 3-glycidoxypropyltrimethoxysilane (Aldrich), 3-aminopropyltris(trimethylsiloxy)silane (Fluka), Coatosil 1770=(epoxycyclohexyl)ethyltriethoxysilane (Witco) and Dynasilan F8261=tridecafluoro-1,1,2,2-tetrahydrooctyl-1-triethoxysilane (ABCR). The sources are in each case indicated in brackets.

Furthermore, the following polymers, for example, are also commercially available: poly(dimethylsiloxane) [=PDMS] [50 cSt DMS-T15] (Gelest/ABCR), poly(dimethylsiloxane) [100 cSt DMS-T21] (Gelest/ABCR), poly(dimethylsiloxane) [200 cSt DMS-T22] (Gelest/ABCR), Wacker Silicone Fluid AK350=PDMS [350 cSt] (Wacker/Interorgana), poly(dimethylsiloxane) [500 cSt DMS-T25] (Gelest/ABCR), poly(dimethylsiloxane) [200 fluid, 1000 cSt] (Aldrich), poly(dimethylsiloxane) [200 fluid, 30000 cSt] (Aldrich), poly(dimethylsiloxane) [30000 cSt DMS-T43] (Gelest/ABCR), Addid 166=polydimethylsiloxane [350 cps]

(Wacker/NRC), Wacker Silicone Fluid M641=mercapto-functionalized PDMS [200 cPs] (Wacker/Interorgana), Wacker Silicone Fluid IM47=α,ω-amino-functionalized PDMS [130 cPs] (Wacker/Interorgana), poly[dimethylsiloxane-co-methylphenylsiloxane] [510 fluid, 50 cSt, 3200 $M_n$, 4900 $M_w$] (Aldrich), poly[dimethylsiloxane-co-methylphenylsiloxane], [510 fluid, 100 cSt] (Aldrich), poly[dimethylsiloxane-co-methylphenylsiloxane] [510 fluid, 500 cSt, 8400 $M_n$, 25000 $M_w$] (Aldrich), poly(methylphenylsiloxane) [500 cSt PMM-0025] (Gelest/ABCR), phenylmethyldimethylsiloxane copolymer [30000 cSt PMM-1043, 63000 $M_n$, 120000 $M_w$] (Gelest/ABCR), poly[dimethylsiloxane-co-methylphenylsiloxane] [710 fluid, 500 cSt] (Aldrich), poly(dimethylsiloxane-co-methylphenylsiloxane, 1:1) [125 cSt PMM-5021] (Gelest/ABCR), Addid 170=polymethylphenylsiloxane [200 cSt] (Wacker/NRC), poly(dimethylsiloxane-co-diphenylsiloxane, 19:1) [100 cSt, PDM-0421] (Gelest/ABCR), poly(dimethylsiloxane-co-diphenylsiloxane, 9:1) [100 cSt, PDM-0821] (Gelest/ABCR), poly(dimethylsiloxane-co-diphenylsiloxane, 4:1), [160–230 cSt, PDM-1922] (Gelest/ABCR), poly(dimethylsiloxane-co-diphenylsiloxane) having trimethylsilyl end groups (Aldrich), ethylmethyl-phenylpropylmethylsiloxane copolymer [ALT-213] (Gelest/ABCR) Byk 323=arylalkyl-modified polymethylalkylsiloxane (Byk), octadecylmethylsiloxane-dimethylsiloxane copolymer [ALT-292] (Gelest/ABCR), poly(dimethylsiloxane-co-alkylsiloxane) (Aldrich), poly[dimethylsiloxane-co-methyl(stearoyloxy-alkyl)siloxane] (Aldrich), poly[dimethylsiloxane-co-methyl-(3-hydroxypropyl)siloxane]-graft-poly(ethylene glycol) methyl ether (Aldrich), Addid 130=polyether-modified PDMS [900 cSt] (Wacker/NRC), Addid 100=polyether-modified PDMS [140 cSt] (Wacker/NRC), Addid 210=polyether-modified PDMS (Wacker/NRC), Byk UV3510=polyether-modified polydimethylsiloxane (Byk), Byk 308=polyether-modified hydroxy-functionalized polydimethylsiloxane (Byk), Byk 333=polyether-modified PDMS (Byk), Byk 344=polyether-modified dimethylpolysiloxane copolymer [52% in xylene/isobutanol 4/1] (Byk), Baysilone® Paint Additive VP 3739=polyether-modified methylpolysiloxane [75% of active compound in Dowanol® DPnB] (Borchers), Dow Corning 54=silicone glycol surfactant (Dow Corning), Dow Corning 56=alkylmethylsiloxane additive (Dow Corning), Byk 310=25% strength solution of polyester-modified PDMS (Byk), poly (3,3,3-trifluoropropylmethylsiloxane) (Gelest/ABCR), poly [trifluoropropyl(methyl)siloxane] having TMS end groups [350 cst] (Apollo Scientific), poly[dimethylsiloxane-co-methyl(3,3,3-trifluoropropyl)siloxane] (Aldrich) and poly[dimethylsiloxane-co-methylsiloxane] (Wacker).

The siloxanes or siloxane-containing compounds listed here are naturally only a selection of substances according to the invention which are commercially available or can be prepared and do not imply any restriction to the scope of the invention.

As described above, a preferred subject matter of the invention concerns solutions of organic semiconductors which are characterized in that they contain at least one siloxane or siloxane-containing compound as additive.

The invention further provides for the use of the solutions of the invention for producing layers of organic semiconductors, in particular polymeric organic semiconductors, on a substrate.

A preferred embodiment is the use of printing processes for producing the organic semiconductor layers. Particular preference is given to using ink jet printing (IJP).

The invention further provides coatings which comprise the organic semiconductors and are produced using the solutions of the invention. Particular preference is given to coatings which have been produced by the above-described printing processes.

Solutions for the purposes of the present invention are mixtures of solid substances in solvents which are liquid and in which the solids are present in molecularly dissolved form, i.e. the majority of the molecules of the solid(s) are actually dissolved and not present in the form of aggregates or nanoparticles or microparticles.

The viscosity of the solutions of the invention is variable. However, particular coating techniques demand the use of particular viscosity ranges. Thus, a range from about 4 to 25 mPa*s is appropriate for coating by IJP. In the case of other printing processes, e.g. gravure printing, a significantly higher viscosity, for example one in the range from 20 to 500 mPa*s, can give advantages.

In the present text and also in the further examples below, the composition of or the use of solutions according to the invention will mostly be directed at polymeric light-emitting diodes and the corresponding displays. Despite this restriction in the description, a person skilled in the art will, without having to make any further inventive step, readily be able to prepare and use appropriate solutions according to the invention in other devices, e.g. for organic integrated circuits (O-ICs), in organic field effect transistors (OFETs), in organic thin-film transistors (OTFTs), for organic solar cells (O-SCs) or organic laser diodes (O lasers), to name only a few applications.

The present invention is illustrated by the following examples without being restricted thereto. A person skilled in the art will, on the basis of the description and the examples provided, readily be able, without making any inventive step, to prepare further solutions or dispersions according to the invention and use them for producing layers.

Additives Used

TABLE 1

Additives used.

| # | Chemical Name | Viscosity | Supplier |
|---|---|---|---|
| ADD1 | Poly(dimethylsiloxane(90)-co-methyl-phenylsiloxane(10)) | 500 mPa * s | ALDRICH |
| ADD2 | Polydimethylsiloxane | 1000 mPa * s | ALDRICH |
| ADD3 | Polydimethylsiloxane | 100 mPa * s | GELEST/ABCR |
| ADD4 | Poly(dimethylsiloxane(95)-co-di-phenylsiloxane(5)) | 100 mPa * s | GELEST/ABCR |
| ADD5 | Poly(dimethylsiloxane) having mercapto end groups | 200 mPa * s | WACKER |

Polymer Solutions Used

TABLE 2

Solutions of organic semiconductors used.
SY18: yellow-emitting PPV derivative, structure analogous to polymer P6 in EP-A-1029019;
HB1341: blue-emitting poly-spiro derivative, structure analogous to polymer P12 in DE 10114477.6.

| # | Polymer | Solvent | Concentration [g/l] | Viscosity [mPa * s] |
|---|---|---|---|---|
| SOL1 | SY18 | 4-Methylanisole | 7.0 | 10.0 @ 500 $s^{-1}$ |
| SOL2 | SY18 | Anisole/o-xylene (1:1) | 11.0 | 18.2 @ 500 $s^{-1}$ |

TABLE 2-continued

Solutions of organic semiconductors used.
SY18: yellow-emitting PPV derivative, structure
analogous to polymer P6 in EP-A-1029019;
HB1341: blue-emitting poly-spiro derivative,
structure analogous to polymer P12 in
DE 10114477.6.

| # | Polymer | Solvent | Concentration [g/l] | Viscosity [mPa * s] |
|---|---------|---------|---------------------|---------------------|
| SOL3 | HB1341 | Anisole/o-xylene (1:1) | 12.3 | 9.6 @ 500 s$^{-1}$ |
| SOL4 | HB1341 | Tetralin | 7.5 | 9.2 @ 500 s$^{-1}$ |

EXAMPLE 1

Wetting and Sliding Properties of Solutions of Organic Semiconductors on Polyimide Treated with a CF$_4$ Plasma As described above in the present text, solutions of organic semiconductors frequently have the problem that they adhere to treated separators. During the course of our present studies, we have found a simple model experiment which simulates this property well, without it being necessary to carry out complicated pressure tests and subsequent microscopic examinations.

It has been found that the following experiment gives a readily comparable result: A substrate whose surface is a homogeneous film of the treated bank material is clamped in an apparatus which allows rotation. The substrate is firstly positioned horizontally (0°). Small drops (about 3–5 µl) of the solution to be examined are then dripped onto the substrate. The substrate is then gradually tilted by mechanical means and the angle at which the drops begin to slide is measured.

Drops which adhere very poorly to the bank material slide at relatively low angles, at the latest at an inclination of about 70°. Drops which adhere well do not slide even on vertically positioned substrates (90°). The angle found is referred to as the sliding angle. If this is 90°, it means that the drop does not slide.

Tests have demonstrated many times that solutions whose drops slide in the experiment also slide in the printing process from the bank material into the pixels, while solutions whose drops do not slide in the test also wet the bank material during printing and do not slide into the pixels. This relationship has not been fully explained, since the drops in the model experiment have a volume which is from 5 to 6 orders of magnitude greater than that in the printing process (5–120 pl compared to 3–5 µl), but the relationship has been demonstrated in many comparative experiments.

The following tests were carried out using polyimide (unstructured) treated with a CF$_4$ plasma as substrate. The following results were obtained using the abovementioned solutions and additives:

TABLE 3

Comparison of sliding angles for various solutions and additive loadings.

| Solution | Additive | Conc. of additive[1] | Sliding angle |
|----------|----------|----------------------|---------------|
| SOL1 | — | — | 90° |
| SOL1 | ADD1 | 0.001% | 84° |
| SOL1 | ADD1 | 0.01% | 59° |
| SOL1 | ADD1 | 0.1% | 38° |
| SOL1 | ADD2 | 0.01% | 67° |
| SOL1 | ADD3 | 0.01% | 55° |
| SOL1 | ADD4 | 0.01% | 62° |
| SOL1 | ADD5 | 0.01% | 63° |
| SOL2 | — | — | 90° |
| SOL2 | ADD1 | 0.001% | 78° |
| SOL3 | — | — | 90° |
| SOL3 | ADD1 | 0.001% | 68° |
| SOL4 | — | — | 90° |
| SOL4 | ADD1 | 0.001% | 73° |
| SOL4 | ADD1 | 0.01% | 61° |
| SOL4 | ADD1 | 0.1% | 40° |
| SOL4 | ADD4 | 0.001% | 75° |
| SOL4 | ADD4 | 0.01% | 60° |
| SOL4 | ADD4 | 0.1% | 37° |

[1]Concentration: m/v (mass/volume based on solvent).

It can readily be seen that the solutions which without additive do not display sliding properties each display a sliding angle of less than 90° as a result of the addition of a small amount of additive. An increasing addition of additive leads to a steady decrease in the sliding angle, with industrially relevant effects being observed in the region of about 0.01% of additive for the solutions examined here.

EXAMPLE 2

EL Tests on Solutions with Additive

As stated in the description above, the solutions of organic semiconductors after addition of additives still have to lead to properties in the respective application which are equivalent to those achieved without additive.

For this reason, the electroluminescence performance (EL) of PLEDs produced from solutions with additives according to the invention has been examined in respect of the most important use properties (efficiency, operating life) and compared with the analogous properties of additive-free solutions.

The preparation of PLEDs was carried out in a manner analogous to the methods described in the above-cited patent documents and is described briefly below. In the interests of simplicity, all test devices were produced via spin coating and not by more complicated printing processes. The detailed procedure was as follows:

The substrates (ITO, about 150 nm on glass) were cleaned by treatment with ultrasound in water containing a washing-up detergent and subsequently prepared further by exposure to UV radiation in an ozone plasma. A thin layer (about 20–30 nm) of PEDOT (commercially available from BAYER) was firstly applied by spin coating to the substrates which had been prepared in this way. These substrates were subsequently transferred to a glove box (exclusion of air!). Here, the layers of light-emitting polymers were then applied by spin coating (thickness: about 60–90 nm). The cathode was then applied onto this by thermal vapor deposition in a high vacuum (<10$^{-6}$ mbar). The results described here were obtained using a double cathode consisting of barium (about 9 nm) and silver (about 100 nm).

Contacts were applied in a standard fashion to the test devices produced in this way and the EL behavior of the devices was examined; the EL life of individual light-emitting diodes was subsequently examined.

TABLE 4

Comparison of EL performance data for different solutions and additive loadings.

| Solution | Additive | Conc. of additive[1] | max. efficiency [Cd/A] | U [V] @ 100 Cd/m$^2$ | $t_{1/2}$ [h] @ 10 mA/cm$^2$ |
|---|---|---|---|---|---|
| SOL1 | — | — | 8.5 | 3.1 | 980 |
| SOL1 | ADD1 | 0.001% | 8.5 | 3.0 | 980 |
| SOL1 | ADD1 | 0.01% | 8.5 | 3.1 | 980 |
| SOL1 | ADD1 | 0.1% | 8.3 | 3.0 | 250 |
| SOL4 | — | — | 1.5 | 5.1 | 80 |
| SOL4 | ADD1 | 0.001% | 1.3 | 4.9 | 100 |
| SOL4 | ADD1 | 0.01% | 1.7 | 5.7 | 90 |
| SOL4 | ADD1 | 0.1% | 1.8 | 4.9 | 30 |
| SOL3 | — | — | 1.5 | 4.7 | 90 |
| SOL3 | ADD2 | 0.001% | 1.5 | 4.5 | 90 |
| SOL3 | ADD2 | 0.01% | 1.6 | 4.6 | 90 |

TABLE 4-continued

Comparison of EL performance data for different solutions and additive loadings.

| Solution | Additive | Conc. of additive[1] | max. efficiency [Cd/A] | U [V] @ 100 Cd/m$^2$ | $t_{1/2}$ [h] @ 10 mA/cm$^2$ |
|---|---|---|---|---|---|
| SOL3 | ADD2 | 0.1% | 1.4 | 5.4 | 50 |
| SOL2 | — | — | 9.1 | 3.1 | >1000 |
| SOL2 | ADD3 | 0.001% | 9.4 | 3.1 | >1000 |
| SOL2 | ADD3 | 0.01% | 9.0 | 3.2 | >1000 |
| SOL2 | ADD3 | 0.1% | 8.5 | 3.3 | 500 |
| SOL2 | — | — | 9.1 | 3.1 | >1000 |
| SOL2 | ADD4 | 0.001% | 9.0 | 3.1 | >1000 |
| SOL2 | ADD4 | 0.01% | 9.1 | 3.1 | >1000 |
| SOL2 | ADD4 | 0.1% | 8.4 | 3.7 | 200 |
| SOL2 | — | — | 9.1 | 3.1 | >1000 |
| SOL2 | ADD5 | 0.001% | 9.4 | 3.1 | >1000 |
| SOL2 | ADD5 | 0.01% | 9.6 | 3.1 | >1000 |
| SOL2 | ADD5 | 0.1% | 8.4 | 3.2 | 700 |

[1]Concentration: m/v based on solvent.

As can easily be seen from the data reported, loading with additive in the range up to about 0.01% has no discernible influence on the performance. At high loadings, a shortening of the device life is generally observed.

However, these experiments also make it clear that industrially usable additive concentrations result in no adverse effects on the use properties.

EXAMPLE 3

Ink Jet Tests on Solutions with Additive

Since the solutions of the invention are envisaged especially for use in printing processes, examination of the printing properties is appropriate. For this reason, experiments on the behavior of solutions with and without additive during printing using an ink jet printing head (IJ printing) have been carried out. The tests were carried out as follows: The solutions were printed using a Spectra Galaxy 256/80 printing head. The printing behavior and important droplet parameters in particular were determined and the results were compared with solutions without additive.

The results are summarized in the following table:

TABLE 5

Comparison of the printing properties of various solutions and additive loadings.

| Solution | Additive | Conc. of additive | Printing parameters | Droplet shape | Mass of droplet | Comment |
|---|---|---|---|---|---|---|
| SOL1 | — | — | 95 V 6.4 μs | Short tail which immediately catches up. | 51 ng | Good printability |
| SOL1 | ADD1 | 0.001% | 100 V 5.4 μs | Short tail which immediately catches up. | 54 ng | Good printability |
| SOL1 | ADD1 | 0.01% | 97 V 5.6 μs | Short tail which immediately catches up. | 52 ng | Good printability |
| SOL1 | ADD1 | 0.1% | 100 V 6.0 μs | Short tail which immediately catches up. | 59 ng | Good printability |

As can readily be seen from the reported data, the printing properties are influenced only inconsequentially by the addition of additive. Problem-free printing can be achieved using an appropriate ink jet printing head both with and without additive.

The invention claimed is:

1. A solution of an organic semiconductor, characterized in that it contains one or more additives, wherein at least one additive is an organic compound containing the heteroatoms silicon, germanium and/or F, or an amphiphile and wherein at least one additive is an organic siloxane-containing compound.

2. A solution as claimed in claim 1, wherein the organic siloxane-containing additive contains one or more —O—SiR$^1$R$^2$ groups, where R$^1$ and R$^2$ are identical or different and are each H, a linear, branched or cyclic $C_1$–$C_{12}$-alkyl group in which one or more nonadjacent carbon atoms may also be are optionally replaced by O or S and one or more H atoms are optionally replaced by F, or a $C_2$–$C_{14}$-aromatic or heteroaromatic which may be are optionally substituted by one or more substituents R$^3$;

R$^3$ are identical or different and are each a linear, branched or cyclic $C_1$–$C_{12}$-alkyl or alkoxy group in which one or more nonadjacent carbon atoms are optionally replaced by O or S and one or more H atoms may be are optionally replaced by F, or F or Cl.

3. A solution as claimed in claim 1, characterized in that the organic siloxane-containing compound is a low molecular weight compound having a molecular weight of less than 1000 g/mol.

4. A solution as claimed in claim 1, characterized in that the organic siloxane-containing compound is a polymer having a molecular weight of at least 1000 g/mol.

5. A process far producing layers of an organic semiconductor on a substrate which comprises using the solution as claimed in claim 1.

6. A processes claimed in claim 5, wherein the process is a printing process for producing the organic semiconductor layers.

7. The process as claimed in claim 6, wherein the process is an ink jet printing process for producing the organic semiconductor layers.

8. A coating which comprises organic semiconductors and has been produced using solutions as claimed in claim 1.

9. A coating which comprises organic semiconductors and has been produced by the process as claimed in claim 5.

10. An electronic component comprising a substrate and the coating as claimed in claim 8.

11. An electronic component as claimed in claim 10, characterized in that it is a polymeric organic light-emitting diode, an organic integrated circuit (O-IC), an organic field effect transistor (OFET), an organic thin-film transistor (OTFT), an organic solar cell (O-SC) or an organic laser diode (O laser).

* * * * *

UNITED STATES PATENT AND TRADEMARK OFFICE
CERTIFICATE OF CORRECTION

PATENT NO. : 7,244,960 B2
APPLICATION NO. : 10/483696
DATED : July 17, 2007
INVENTOR(S) : Hubert Spreitzer et al.

It is certified that error appears in the above-identified patent and that said Letters Patent is hereby corrected as shown below:

In the Claims:

In Claim 2,
in column 12 and line 60,
"one or more nonadjacent carbon atoms may also be are" should read
-- one or more nonadjacent carbon atoms are -- in column 12 and line 63,
"heteroaromatic which may be are optionally substituted" should read
-- heteroaromatic which are optionally substituted -- in column 13 and line 1,

"by O or S and one or more H atoms may be are" should read

-- by O or S and one or more H atoms are --

Signed and Sealed this

Eighteenth Day of December, 2007

JON W. DUDAS
*Director of the United States Patent and Trademark Office*